(12) United States Patent
Serizawa et al.

(10) Patent No.: US 10,584,951 B2
(45) Date of Patent: Mar. 10, 2020

(54) WIRELESS COMMUNICATION MODULE AND WIRELESS COMMUNICATION DEVICE

(71) Applicant: Renesas Electronics Corporation, Tokyo (JP)

(72) Inventors: Tatsuya Serizawa, Tokyo (JP); Yoshihiro Hayashi, Tokyo (JP); Noriaki Matsuno, Tokyo (JP)

(73) Assignee: Renesas Electronics Corporation, Tokyo (JP)

( * ) Notice: Subject to any disclaimer, the term of this patent is extended or adjusted under 35 U.S.C. 154(b) by 28 days.

(21) Appl. No.: 15/954,675

(22) Filed: Apr. 17, 2018

(65) Prior Publication Data

US 2018/0340765 A1    Nov. 29, 2018

(30) Foreign Application Priority Data

May 23, 2017    (JP) .................................. 2017-101453

(51) Int. Cl.

| | | |
|---|---|---|
| *G01B 7/02* | (2006.01) | |
| *G06F 1/3231* | (2019.01) | |
| *H04B 1/401* | (2015.01) | |
| *G06F 1/16* | (2006.01) | |
| *G01D 5/24* | (2006.01) | |
| *H01Q 9/04* | (2006.01) | |
| *H04B 1/3827* | (2015.01) | |
| *G01R 27/26* | (2006.01) | |
| *G01R 27/04* | (2006.01) | |

(52) U.S. Cl.
CPC .............. *G01B 7/023* (2013.01); *G01D 5/24* (2013.01); *G06F 1/1684* (2013.01); *G06F 1/1698* (2013.01); *G06F 1/3231* (2013.01); *H04B 1/401* (2013.01); *G01R 27/04* (2013.01); *G01R 27/2605* (2013.01); *H01Q 9/04* (2013.01); *H01Q 9/0407* (2013.01); *H04B 1/385* (2013.01)

(58) Field of Classification Search
CPC ........ G01B 7/023; H04B 1/401; H04B 1/385; G06F 1/3231; G01D 5/24; G01R 27/04; G01R 27/2605; H01Q 9/0407; H01Q 9/04
USPC ....................................... 324/755.05; 702/12
See application file for complete search history.

(56) References Cited

U.S. PATENT DOCUMENTS

| | | | |
|---|---|---|---|
| 2012/0122414 A1* | 5/2012 | Noguchi .................. | H01Q 3/24 455/226.2 |
| 2013/0261979 A1* | 10/2013 | Al-Muthana ............ | G01V 3/38 702/12 |
| 2014/0087786 A1* | 3/2014 | Tani ....................... | H04M 1/026 455/556.1 |

(Continued)

FOREIGN PATENT DOCUMENTS

| | | |
|---|---|---|
| JP | 2010-124137 A | 6/2010 |
| JP | 2014-82735 A | 5/2014 |

*Primary Examiner* — Farhana A Hoque
(74) *Attorney, Agent, or Firm* — Mattingly & Malur, PC

(57) ABSTRACT

To provide a wireless communication module that implements the function to detect a human body in a conserved space and is capable of detecting a proximity to human bodies with high accuracy. A wireless communication module includes an antenna unit and a proximity detector which detects that a human body has approached the module. The antenna unit includes an antenna and a first filter which is comprised of distributed constant elements. The proximity detector for human bodies uses the antenna and the first filter as an electrode to detect capacitance.

8 Claims, 12 Drawing Sheets

(56) References Cited

U.S. PATENT DOCUMENTS

2016/0087343 A1* 3/2016 Chang ................... H01Q 1/245
 343/720
2016/0381553 A1* 12/2016 Lee ....................... H04W 12/06
 455/411

* cited by examiner

WIRELESS COMMUNICATION MODULE AND WIRELESS COMMUNICATION DEVICE

CROSS-REFERENCE TO RELATED APPLICATIONS

The disclosure of Japanese Patent Application No. 2017-101453 filed on May 23, 2017 including the specification, drawings and abstract is incorporated herein by reference in its entirety.

BACKGROUND

The present invention relates to a wireless communication module and a wireless communication device and relates to a wireless communication module and a wireless communication device equipped with a function to detect that, for example, a human body has approached the module or device.

Recently, wearable devices and mobile cellular devices or the like equipped with radio functionality are in widespread use. These devices are desired to be equipped with a function that changes an operating state or the like when having detected a human body (dielectric body).

In Patent Document 1, disclosed is a technology in which a high-speed oscillation circuit stops an oscillating operation while a human sensor does not detect a human body and, when the human sensor unit detects a human body, the high-speed oscillation circuit starts an oscillating operation and a wireless transmitter performs data transmission in synchronization with an oscillation signal of the high-speed oscillation circuit.

In the technology disclosed in Patent Document 1, a human sensor that is installed separately from an antenna is required. As the human sensor, it is known that, e.g., a camera, an infrared sensor, or the like is used. This has posed a problem in which installation of the human sensor makes it difficult to downsize the device.

In Patent Document 2, disclosed is an example of implementing a function to detect a human body in a conserved space. In Patent Document 2, disclosed is a technology in which an antenna element for a wireless communication circuit is also used as a capacitance detecting element for a capacitance-type proximity detecting sensor circuit.

RELATED ART DOCUMENTS

Patent Documents

[Patent Document 1]
Japanese Unexamined Patent Application Publication No. 2010-124137
[Patent Document 2]
Japanese Unexamined Patent Application Publication No. 2014-82735

SUMMARY

However, the technology disclosed in Patent Document 2 has encountered a problem in which it can happen that a capacitance value of the antenna element is less than a capacitance value necessary for detecting a proximity to human bodies with high accuracy.

Other problems and novel features will become apparent from the description in the present specification and the accompanying drawings.

According to one embodiment, a wireless communication module is equipped with a proximity detector for human bodies which uses an antenna and a first filter which is comprised of distributed constant elements as an electrode to detect capacitance.

According to the one embodiment, it is possible to provide a wireless communication module that implements the function to detect a human body in a conserved space and is capable of detecting a proximity to human body with high accuracy.

DETAILED DESCRIPTION

In the following description of embodiments, an embodiment is divided into plural sections or embodiments, when necessary for convenience sake, and these sections or embodiments are described; they are not independent of each other, unless otherwise specified, and they relate to one another such that one is an example of modification to, an example of application of, detailed description, or supplementary description, etc. of another in part or whole. In the following description of embodiments, where the number of elements among others (including the number of pieces, a numeric value, quantity, range, etc.) is mentioned, that number should not be limited to a particular number mentioned and may be more or less than the particular number, unless otherwise specified and unless that number is, in principle, obviously limited to the particular number.

Besides, for an embodiment which will be described hereinafter, its components (including operational steps or the like) are not always requisite, unless otherwise specified and unless such components are, in principle, considered to be obviously requisite.

In the following, embodiments will be described with reference to the drawings. To clarify explanation, descriptions which will be provided hereinafter and drawings are partially omitted and simplified, as appropriate. And now, in the respective drawings, identical elements are assigned a like designator and their duplicated description is omitted, as necessary.

First Embodiment

Figure 1:
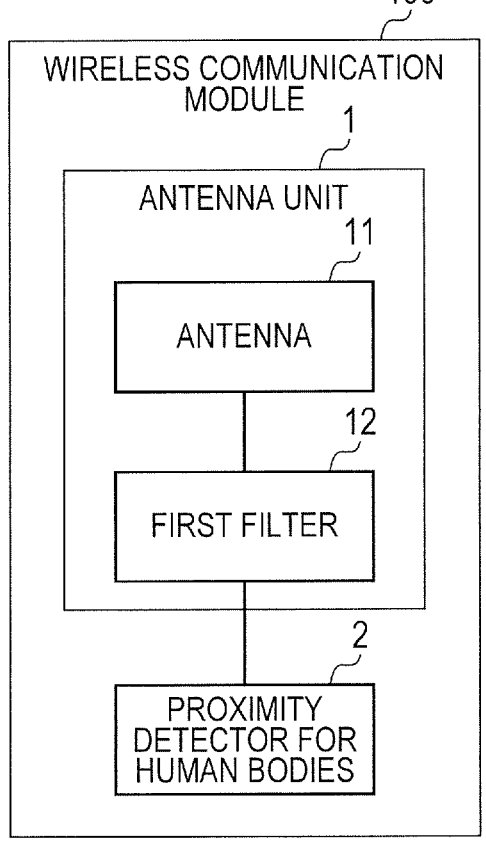
FIG. 1 is a block diagram depicting a configuration example of a wireless communication module pertaining to a first embodiment.

FIG. 1 is a block diagram depicting a configuration example of a wireless communication module 100 pertaining to a first embodiment. The wireless communication module 100 includes an antenna unit 1 and a proximity detector 2 for human bodies. The antenna unit 1 includes an antenna 11 and a first filter 12.

The antenna 11 is used for wireless communication by the wireless communication module 100. And now, the antenna 11 is, for example, a planar antenna such as a patch antenna and a linear antenna.

The first filter 12 is coupled to the antenna 11. Also, the first filter 12 is comprised of distributed constant elements.

The proximity detector 2 for human bodies is a functional part to detect that a human body (dielectric body) has approached the module. The proximity detector 2 is coupled to the first filter 12. The proximity detector 2 uses the antenna 11 and the first filter 12 as an electrode to detect capacitance.

Subsequently, descriptions are provided about the shape of the antenna unit 1 of the wireless communication module 100, using FIGS. 2 and 3.

Figure 2:
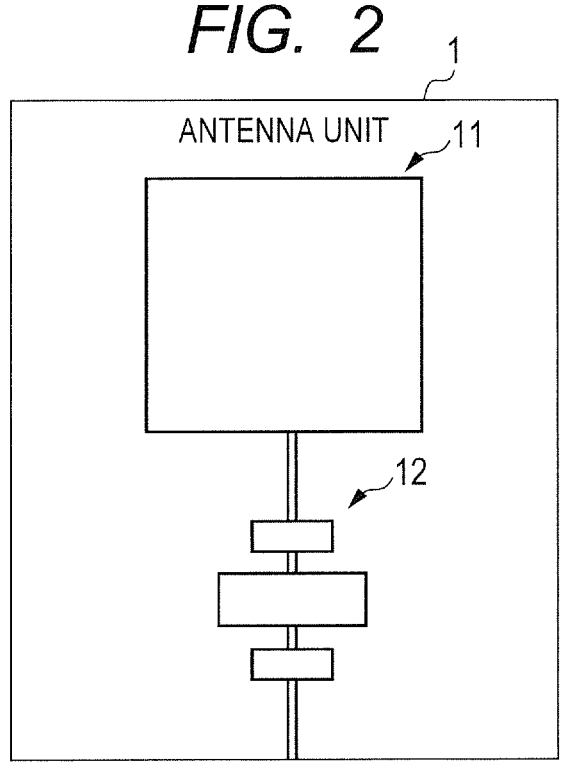
FIG. 2 is a block diagram depicting one example of the shape of an antenna unit of the wireless communication module pertaining to the first embodiment.

FIG. 2 is a diagram depicting one example of the shape of the antenna unit 1 of the wireless communication module 100. In the example of FIG. 2, the antenna 11 is a patch antenna and the first filter 12 is an LPF (low-pass filter) which is comprised of distributed constant elements. And now, descriptions are provided below for a case where a radio signal that is transmitted and received by the antenna 11 is assumed to have a frequency of 2.4 GHz.

The antenna 11 is configured into a shape having a resonance point at 2.4 GHz. Thereby, the antenna 11 can be used for 2.4 GHz wireless communication.

The first filter 12 is the LPF having a high impedance characteristic against 2.4 GHz. Hence, by the first filter 12, it is possible to prevent a 2.4 GHz radio communication signal from flowing out from the antenna 11 to the proximity detector 2 for human bodies.

Besides, the antenna 11 has a square shape and, owing to this area, it will operate as an electrode to detect capacitance which generates capacitance, interacting with a human body. Also, the first filter 12, similarly owing to its area, will operate as an electrode to detect capacitance.

Figure 3:
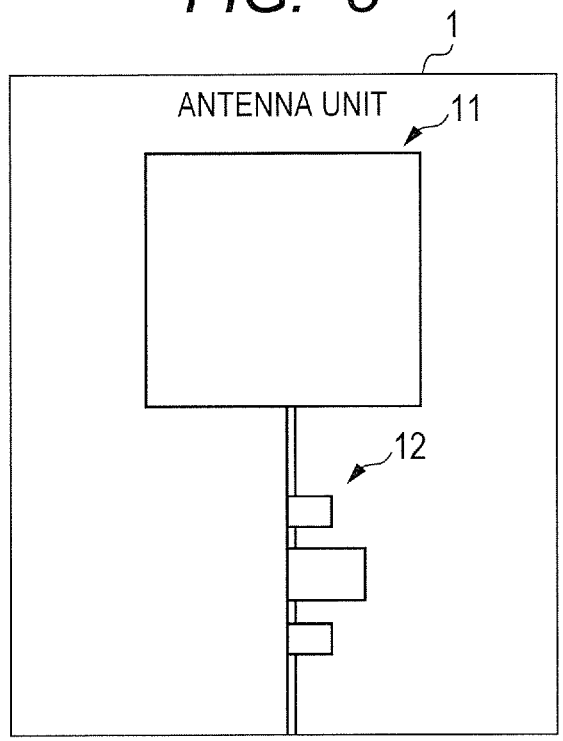
FIG. 3 is a block diagram depicting another example of the shape of the antenna unit of the wireless communication module pertaining to the first embodiment.

FIG. 3 is a diagram depicting another example of the shape of the antenna unit 1 of the wireless communication module 100. In the example of FIG. 3, the antenna 11 is a patch antenna and the first filter 12 is a BEF (band elimination filter) which is comprised of distributed constant elements. That is, in FIG. 3, the BEF is used instead of the LPF in FIG. 2. The first filter 12 has a resonance point at 2.4 GHz and operates as a notch filter. Hence, by the first filter 12, it is possible to prevent a 2.4 GHz radio communication signal from flowing out from the antenna 11 to the proximity detector 2 for human bodies.

Although a patch antenna is used as the antenna 11 in the examples of FIG. 2 and FIG. 3, a linear antenna may be used. For a linear antenna, capacitance between the antenna and GND (ground) is low in comparison with a patch antenna. Hence, using a linear antenna as the antenna 11 in an alternative configuration can make it easy to detect a change in capacitance between the antenna and a human body, as compared with the configuration using a patch antenna.

As described above, the wireless communication module 100 pertaining to the first embodiment is configured including the antenna 11, the first filter 12, and the proximity detector 2 for human bodies. Also, in the wireless communication module 100 thus configured, the proximity detector 2 for human bodies uses the antenna 11 and the first filter 12 as an electrode to detect capacitance. Thereby, in the wireless communication module 100 pertaining to the first embodiment, it is possible to provide a wireless communication module that implements the function to detect a human body in a conserved space and is capable of proximity detection for human bodies with high accuracy.

Modification Example of First Embodiment

Figure 4:
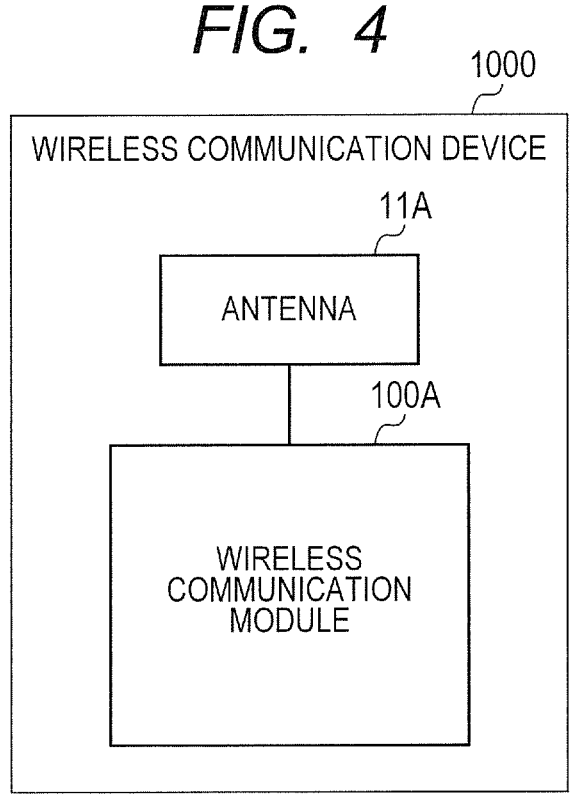
FIG. 4 is a block diagram depicting a configuration example of a wireless communication device with a wireless communication module pertaining to a modification example of the first embodiment installed therein.

FIG. 4 is a block diagram depicting a configuration example of a wireless communication device 1000 with a wireless communication module 100A pertaining to a modification example of the first embodiment installed therein. The wireless communication device 1000 is, for example, a wearable device. The wireless communication device 1000 includes an antenna 11a and the wireless communication module 100A.

The antenna 11A is used for wireless communication by the wireless communication module 100A. And now, the antenna 11A is, for example, a non-planar monopole antenna. The antenna 11A may be a planar antenna such as a patch antenna and a linear antenna.

Figure 5:
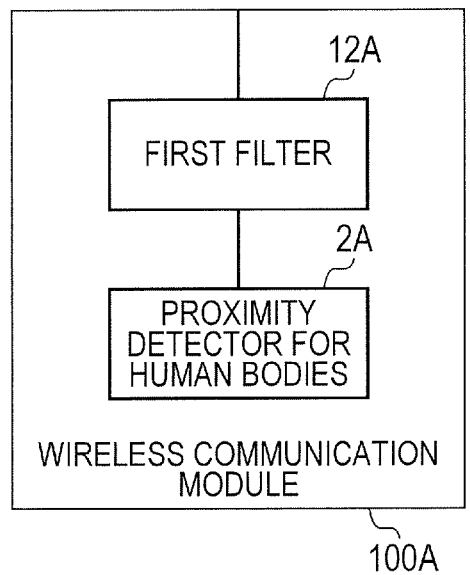
FIG. 5 is a block diagram depicting a configuration example of the wireless communication module pertaining to the modification example of the first embodiment.

Subsequently, descriptions are provided about the wireless communication module 100A pertaining to the modification example of the first embodiment, using a block diagram of FIG. 5. The wireless communication module 100A includes a first filter 12A and a proximity detector 2A for human bodies.

The first filter 12A is coupled to the antenna 11A. Also, the first filter 12A is comprised of distributed constant elements.

The proximity detector 2A for human bodies is a functional part to detect that a human body (dielectric body) has approached the module. The proximity detector 2A is coupled to the first filter 12A. The proximity detector 2A uses the antenna 11A and the first filter 12A as an electrode to detect capacitance.

As described above, the wireless communication module 100A pertaining to the modification example of the first embodiment is configured such that it is installed in the wireless communication device 1000. Also, the wireless communication module 100A is configured including the first filter 12A and the proximity detector 2A for human bodies. Moreover, in the wireless communication module 100A thus configured, the proximity detector 2A uses the first filter 12A and the antenna 11A of the wireless communication device 1000 as an electrode to detect capacitance. Thereby, in the wireless communication module 100A pertaining to the modification example of the first embodiment, it is possible to provide a wireless communication module that implements the function to detect a human body in a conserved space and is capable of proximity detection for human bodies with high accuracy. Also, because the wireless communication module 100A does not include an antenna, the size of the wireless communication module can be made smaller, as compared with the wireless communication module 100 pertaining to the first embodiment.

Second Embodiment

Subsequently, descriptions are provided about a wireless communication module 100B which is one example of a configuration of a wireless communication module pertaining to a second embodiment, using a block diagram of FIG. 6. The wireless communication module 100B includes an antenna unit 1, a proximity detector 2 for human bodies, and a radio control unit 3. Also, the antenna unit 1 includes an antenna 11 and a first filter 12. Moreover, the radio control unit 3 includes a transceiver 31, an arithmetic processor 32, and a halt controller 33, The arithmetic processor 32 is a functional part that controls operation of the transceiver 31. The transceiver 31 is coupled to the antenna 11. Also, the transceiver 31 performs wireless communication through the antenna 11 under control of the arithmetic processor 32.

The halt controller 33 is a functional part that controls an active state of at least one of the arithmetic processor 32 and the transceiver 31, based on a result of detection by the proximity detector 2. Here, controlling an active state of the arithmetic processor 32 is activating or deactivating the arithmetic processor 32. Also, controlling an active state of the transceiver 31 is activating or deactivating the transceiver 31.

Figure 6:
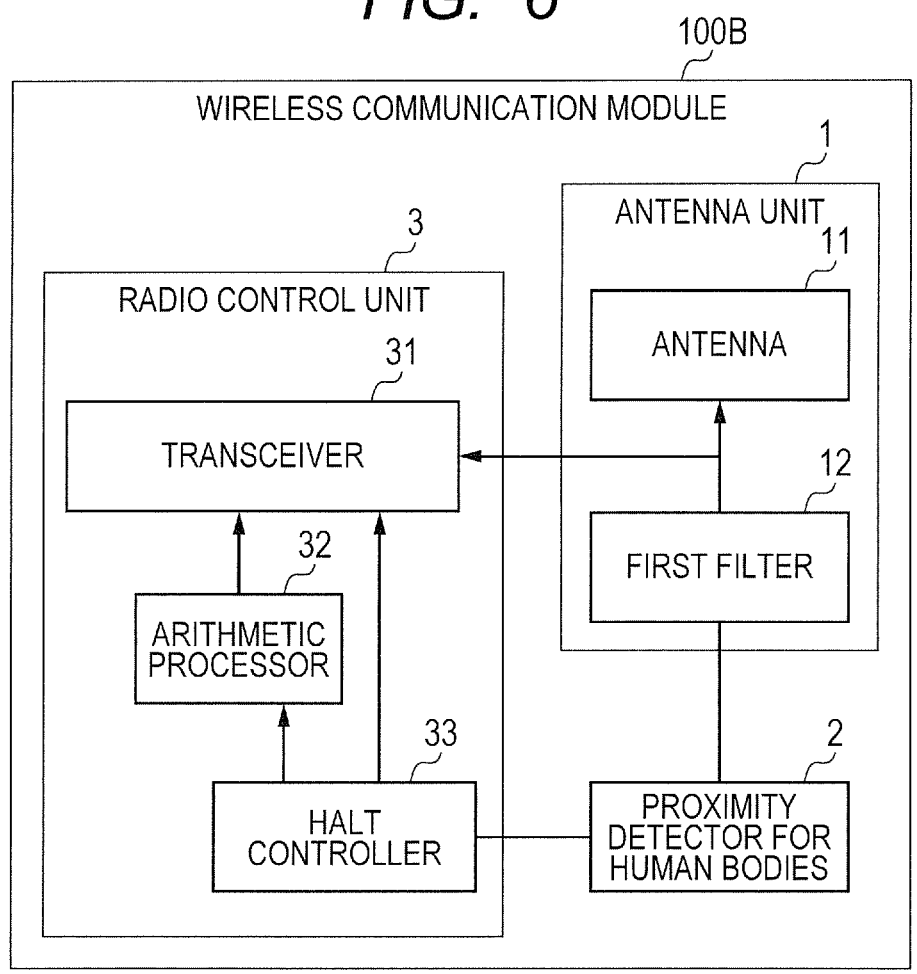
FIG. 6 is a block diagram depicting one example of a configuration of a wireless communication module pertaining to a second embodiment.

As described above, the wireless communication module 100B in FIG. 6 is configured such that the halt controller 33 controls an active state of at least one of the arithmetic processor 32 and the transceiver 31, based on a result of detection by the proximity detector 2. Thereby, the wireless communication module 100B in FIG. 6 can perform control to activate at least one of the arithmetic processor 32 and the transceiver 31 when having detected that a human body has approached the module. Also, the wireless communication module 100B in FIG. 6 can perform control to deactivate at least one of the arithmetic processor 32 and the transceiver 31 when having detected that a human body does not approach the module.

Subsequently, descriptions are provided about a wireless communication module 100C which is another example of a configuration of a wireless communication module pertaining to the second embodiment, using a block diagram of FIG. 7. The wireless communication module 100C includes an antenna unit 1, a proximity detector 2 for human bodies, a radio control unit 3C, a first oscillator 4, a second oscillator 5, and a second filter 6. Also, the antenna unit 1 includes an antenna 11 and a first filter 12. Moreover, the radio control unit 3 includes a transceiver 31C, an arithmetic processor 32C, and a halt controller 33C.

The first oscillator 4 is an oscillator which oscillates a first clock signal with a first frequency. The first frequency is, for example, 32.768 kHz. The first oscillator 4 supplies the first frequency to the halt controller 33C. The first frequency is also supplied to the proximity detector 2 via the halt controller 33C.

The second oscillator 5 is an oscillator which oscillates a second clock signal with a second frequency which is higher than the first frequency. The second frequency is, for example, 32 MHz. The second oscillator 5 supplies the second frequency to the transceiver 31C and the arithmetic processor 32C.

In the following, descriptions are provided for a case where the first frequency is assumed to be 32.768 kHz and the second frequency is assumed to be 32 MHz.

The transceiver 31C and the arithmetic processor 32C operate on the second clock signal. That is, the arithmetic processor 32C operates on the second clock signal and controls wireless communication by the transceiver 31C. Also, the transceiver 31C operates on the second clock signal and transmits and receives a 2.4 GHz radio signal.

The halt controller 33C operates on the first clock signal. That is, the halt controller 33C operates on the first clock signal of 32.768 kHz and can perform control of an active state of the transceiver 31C and the arithmetic processor 32C which operate on the second clock signal of 32 MHz.

The proximity detector 2 for human bodies detects a change in capacitance of the antenna 11 and the first filter 12 through the use of the first clock signal.

The first filter 12 allows passage of 32.768 kHz and attenuates 2.4 GHz. Also, the second filter 6 allows passage of 2.4 GHz and attenuates 32.768 kHz. And now, the second filter 6 is, for example, a HPF (high-pass filter) which is comprised of lumped constant elements.

Figure 7:
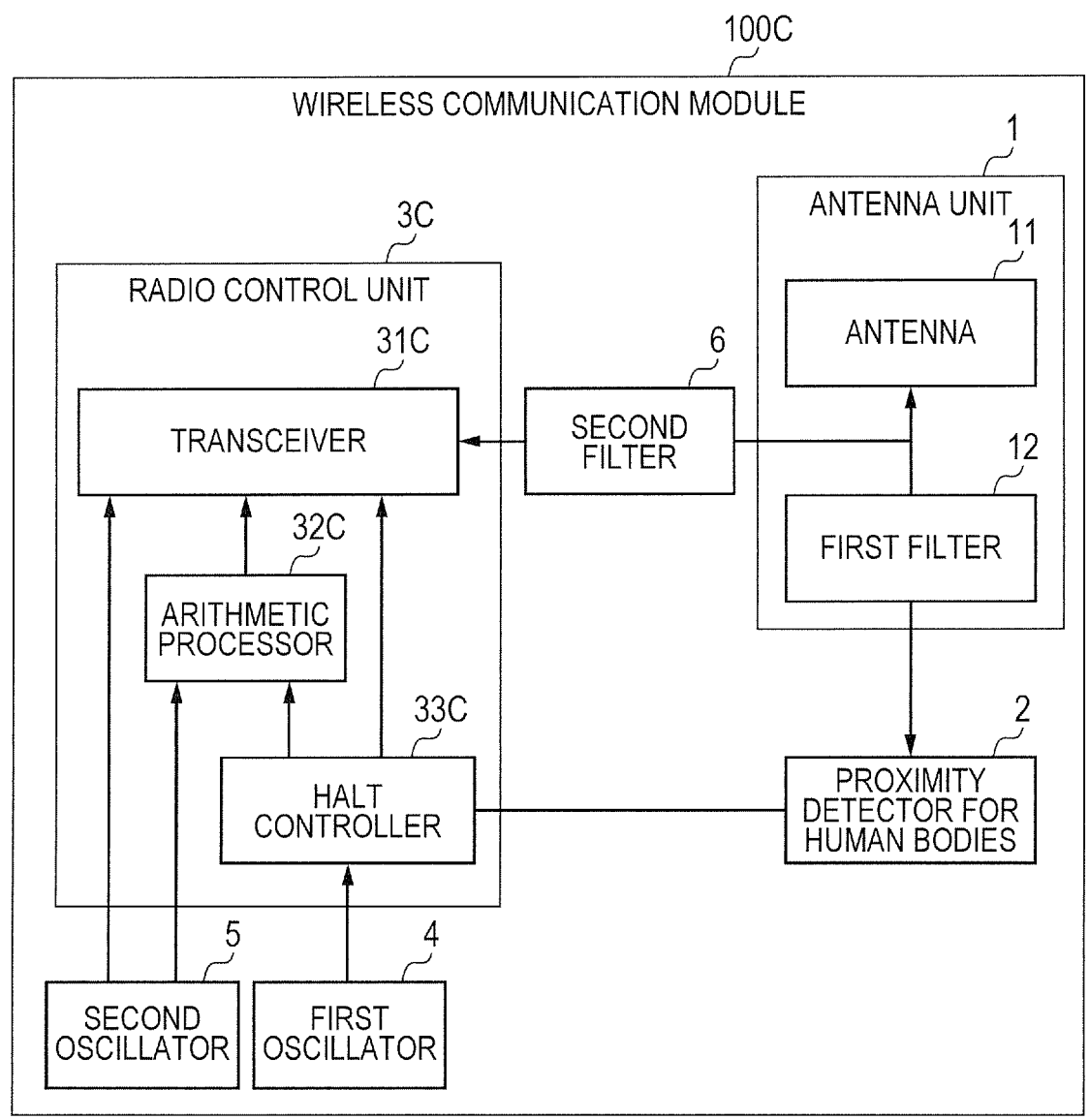
FIG. 7 is a block diagram depicting another example of a configuration of a wireless communication module pertaining to the second embodiment.

As described above, the wireless communication module 100C in FIG. 7 is configured including the first oscillator 4 and the second oscillator 5. Also, in the wireless communication module 100C thus configured, the halt controller 33C operates on 32.768 kHz and the transceiver 31C and the arithmetic processor 32C operate on 32 MHz. Thereby, in the wireless communication module 100C, control of an activate state of the transceiver 31C and the arithmetic processor 32C which operate on the second frequency of 32 MHz can be performed by the halt controller 33C which operates on the first clock signal of 32.768 kHz. That is, the wireless communication module 100C can be designed for low power consumption.

Besides, the wireless communication module 100C is configured such that the proximity detector 2 for human bodies detects a change in capacitance of the antenna 11 and the first filter 12 through the use of the first clock signal. Thereby, in the wireless communication module 100C, the first clock signal of 32.768 kHz can be used in detecting capacitance by the proximity detector 2.

Besides, the wireless communication module 100C is configured such that the first filter 12 allows passage of 32.768 kHz and attenuates 2.4 GHz. Thereby, in the wireless communication module 100C, it is possible to prevent a 2.4 GHz radio communication signal from flowing out from a signal path which is formed by the antenna 11 and the transceiver 31C to the proximity detector 2.

Besides, the wireless communication module 100C is configured such that the second filter 6 allows passage of 2.4 GHz and attenuates 32.768 kHz. Thereby, in the wireless communication module 100C, it is possible to prevent the first clock signal of 32.768 kHz flowing out from a signal path which is formed by the antenna 11 and the proximity detector 2 to the transceiver 31C.

Furthermore, the wireless communication module 100C includes the first filter 12 and the second filter 6, thereby enabling it to isolate the transceiver 31C from the proximity detector 2.

Modification Example of Second Embodiment

Figure 8:
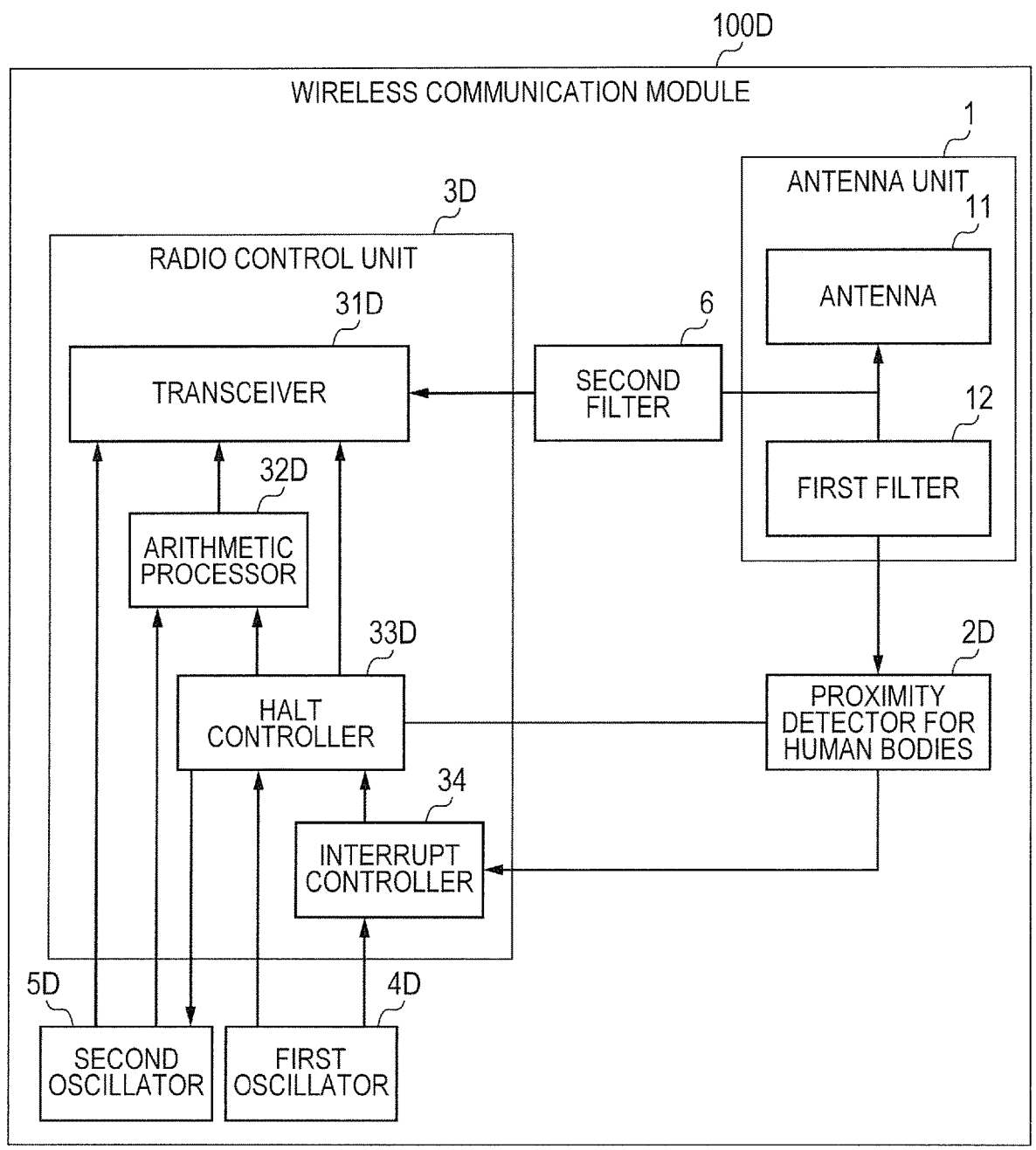
FIG. 8 is a block diagram depicting a configuration example of a wireless communication module pertaining to a modification example of the second embodiment.

FIG. 8 is a block diagram depicting a configuration example of a wireless communication module 100D pertaining to a modification example of the second embodiment. The wireless communication module 100D includes an antenna unit 1, a proximity detector 2D for human bodies, a radio control unit 3D, a first oscillator 4D, a second oscillator 5D, and a second filter 6. Also, the antenna unit 1 includes an antenna 11 and a first filter 12. Moreover, the radio control unit 3D includes a transceiver 31D, an arithmetic processor 32D, a halt controller 33D, and an interrupt controller 34.

The first oscillator 4D is an oscillator for a halt state of the radio control unit 3D for the purpose of reducing power consumption. Here, the halt state of the radio control unit 3D refers to a state in which the interrupt controller 34, the halt controller 33D, and the proximity detector 2D for human bodies only operate on the first clock signal of 32.768 kHz and other components are inactive.

The second oscillator 5D is an oscillator which is deactivated during the halt state of the radio control unit 3D and oscillates when in normal operation. The second oscillator 5D supplies the second clock signal to the transceiver 31D and the arithmetic processor 32D when in normal operation.

Figure 9:
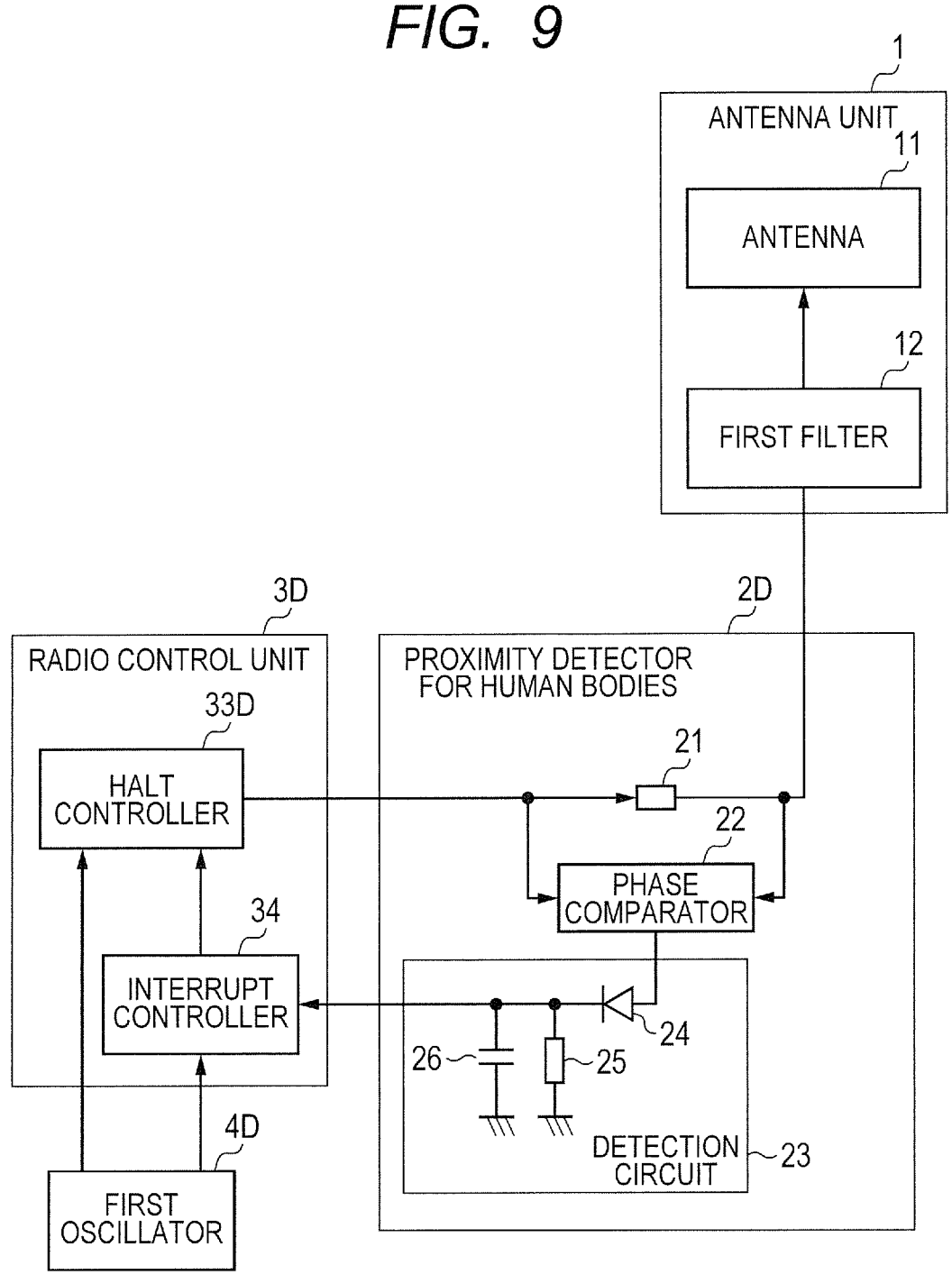
FIG. 9 is a diagram to explain a concrete example of a proximity detector for human bodies pertaining to the modification example of the second embodiment.

Now, descriptions are provided about a concrete example of a proximity detector 2D for human bodies, using FIG. 9. In FIG. 9, parts of the wireless communication module 100D, which are irrelevant to proximity detection to human bodies, are omitted from depiction. And now, a configuration of the proximity detector 2D is one example and no limitation to this is intended.

In the example of FIG. 9, the proximity detector 2D for human bodies includes a resistor 21, a phase comparator 22, and a detection circuit 23. Also, the detection circuit 23 includes a diode 24, a resistor 25, and a capacitor 26.

During the halt state of the radio control unit 3D, the first clock signal of 32.768 kHz is supplied to the antenna unit 1 via the halt controller 33D and the resistor 21. The proximity detector 2D detects a phase difference of the first clock signal which is generated by a change in capacitance of the antenna unit 1 and the resistor 21 through the phase comparator 22 and the detection circuit 23 and generates a DC voltage signal D. That is, the proximity detector 2D generates a DC voltage signal D depending on a change in capacitance of the antenna unit 1. Then, the proximity 2D outputs the DC voltage signal D to the interrupt controller 34.

Returning to FIG. 8, we will continue with the description. When the interrupt controller 34 receives the DC voltage signal D from the proximity detector 2D, it determines whether or not the DC voltage signal is more than a predetermined threshold. If the DC voltage signal is more than the predetermined threshold, the interrupt controller 34 generates an interrupt signal and outputs it to the halt controller 33D.

Upon receiving input of the interrupt signal, the halt controller 33D activates the transceiver 31D, the arithmetic processor 32D, and the second oscillator 5D. At the same time, upon receiving input of the interrupt signal, the halt controller 33D stops supplying the first clock signal of 32.768 kHz to the antenna unit 1. Thereby, the radio control unit 3D is placed in normal operation mode.

When the transceiver 31D is activated, it performs wireless communication under control of the arithmetic processor 32D. Upon completion of wireless communication by the transceiver 31D, the halt controller 33D deactivates the transceiver 31D, the arithmetic processor 32D, and the second oscillator 5D. At the same time, upon completion of wireless communication by the transceiver 31D, the halt controller 33D starts supplying the first clock signal of 32.768 kHz to the antenna unit 1. Thereby, the radio control unit 3D is placed in the halt state.

Figure 10:
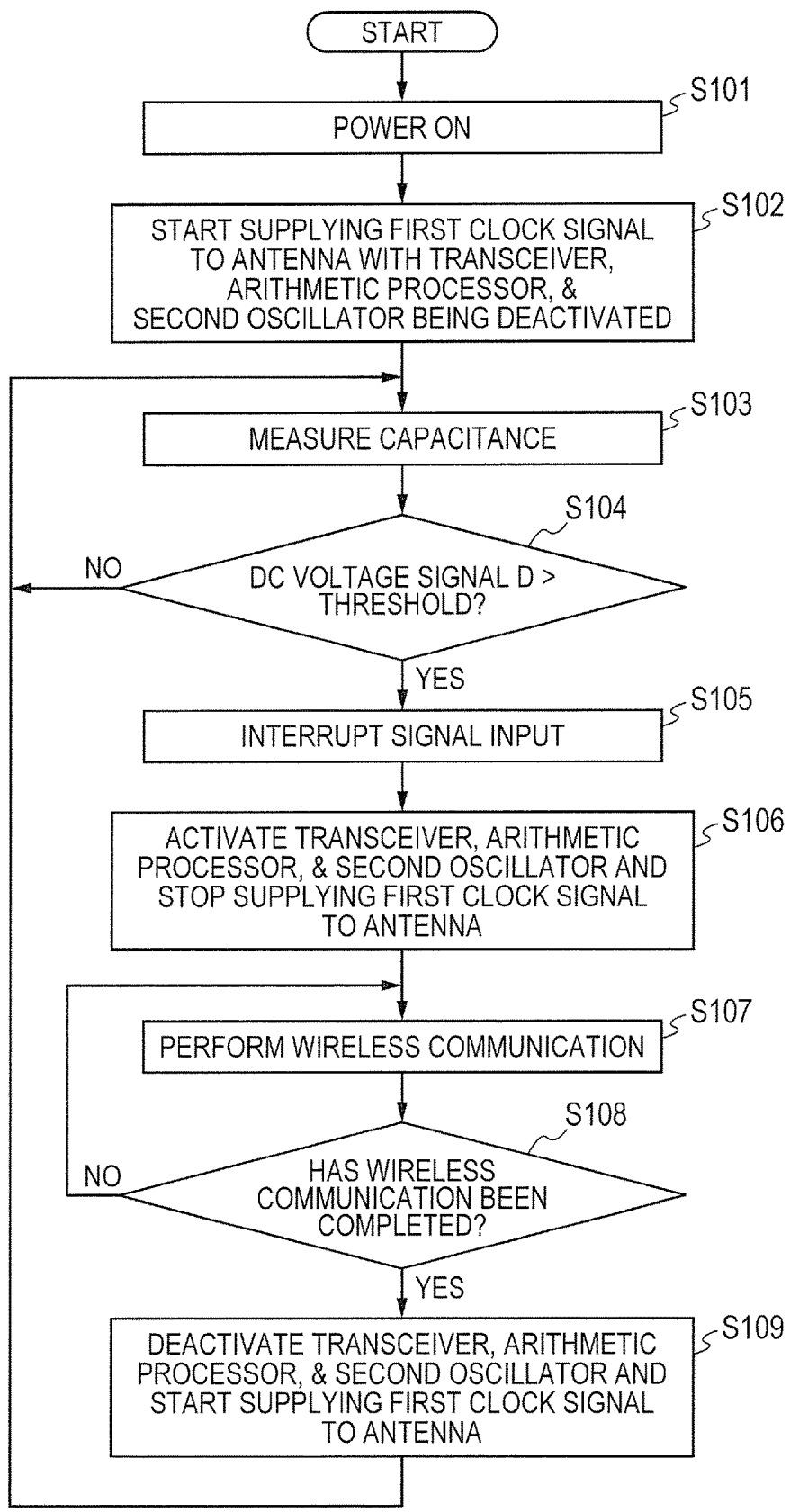
FIG. 10 is a flowchart illustrating an example of operation of the wireless communication module pertaining to the modification example of the second embodiment.

Subsequently, descriptions are provided about an example of operation of the wireless communication module 100D pertaining to the modification example of the second embodiment, using a flowchart of FIG. 10.

After power-on of the wireless communication module 100D (step S101), first, the halt controller 33D deactivates the transceiver 31D, the arithmetic processor 32D, and the second oscillator 5D and starts supplying the first clock signal to the antenna unit 1 (step S102).

Then, the proximity detector 2D for human bodies measures capacitance of the antenna unit 1 (step S103). That is, the proximity detector 2D generates a DC voltage signal D depending on a change in capacitance of the antenna unit 1.

Then, the interrupt controller 34 determines whether or not the DC voltage signal D is more than a predetermined threshold (step S104).

If the DC voltage signal D is equal to or less than the predetermined threshold (NO at step S104), the procedure returns to step S103. Otherwise, if the DC voltage signal D is more than the predetermined threshold (YES at step S104), an interrupt signal is input to the halt controller 33D (step S105).

Then, the halt controller 33D activates the transceiver 31D, the arithmetic processor 32D, and the second oscillator 5D and stops supplying the first clock signal to the antenna unit 1 (step S106).

Then, the transceiver 31D performs wireless communication (step S107). Then, the halt controller 33D determines whether or not wireless communication has been completed (step S108).

If wireless communication is not completed (NO at step S108), the procedure returns to step S107. Otherwise, if wireless communication has been completed (YES at step S108), the halt controller 33D deactivates the transceiver 31D, the arithmetic processor 32D, and the second oscillator 5D and starts supplying the first clock signal to the antenna unit 1 (step S109). After step S109, the procedure returns to step S103.

Figure 11:
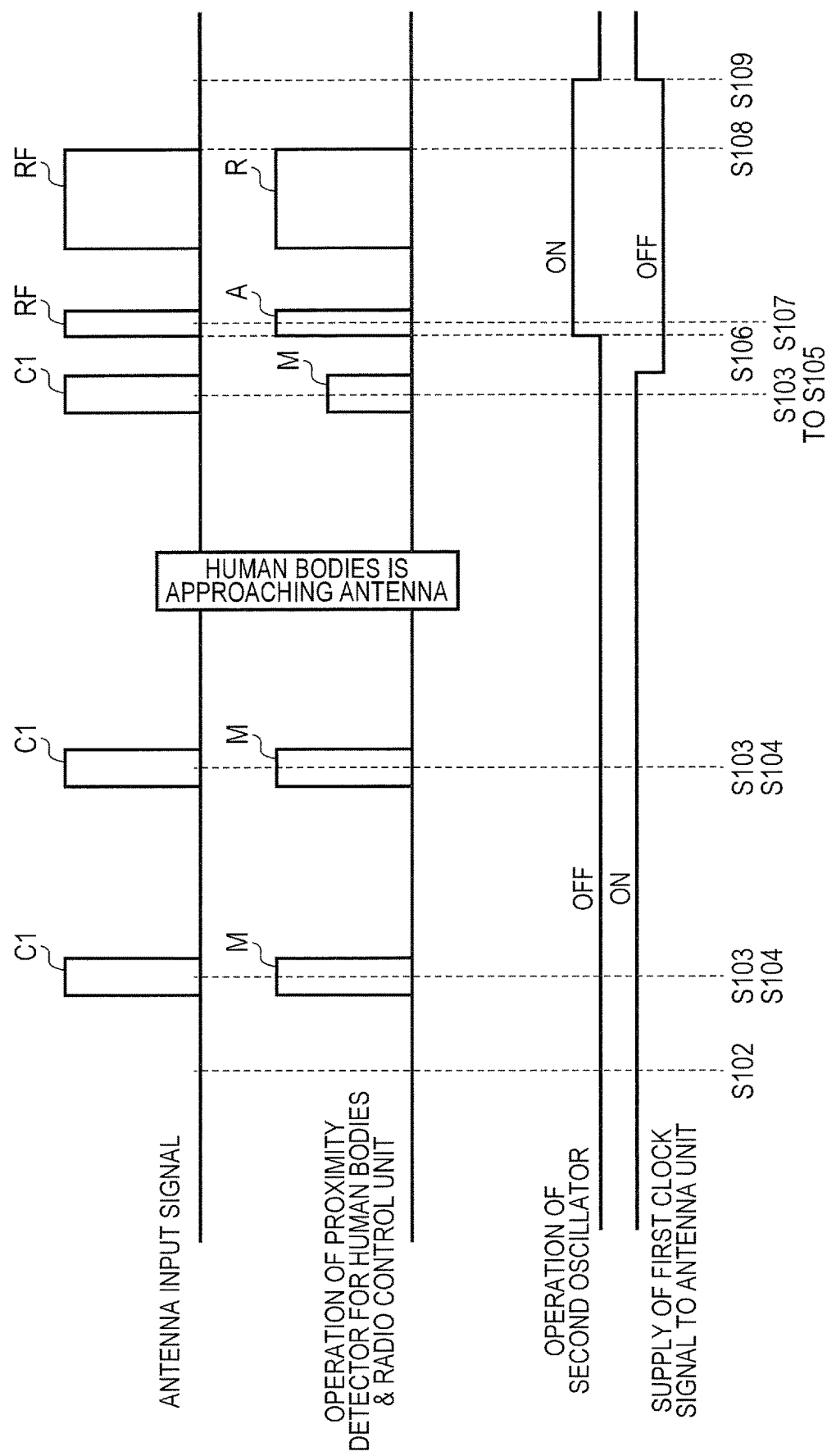
FIG. 11 is a diagram depicting examples of waveforms with regard to the operation in FIG. 10.

Subsequently, with FIG. 11, descriptions are provided about examples of waveforms with regard to the operation in FIG. 10. In FIG. 11, the abscissa indicates passage of time. "Antenna input signal" in FIG. 11 represents a distinctive signal that is input to the antenna 11. Also, "operation of proximity detector and radio control unit" represents a distinctive operation of the proximity detector 2D for human bodies and the radio control unit 3D. Also, "operation of second oscillator" represents activation (ON) or deactivation (OFF) of the second oscillator 5D. Also, "supply of first clock signal to the antenna unit" represents that the first clock signal is supplied (ON) or not supplied (OFF) to the antenna unit 1.

At step S103, the antenna input signal is the first clock signal (C1) and measurements (M) of capacitance of the antenna unit 1 are taken by the proximity detector 2D. And now, the ordinate for measurements (M) of capacitance indicates large/small capacitance measured.

In a state when a human body does not approach the antenna, the DC voltage signal D depending on a change in capacitance of the antenna unit 1 will be equal to or less than the predetermined threshold at step S104. Hence, the procedure returns to step S103.

When a human body is approaching the antenna unit 1, for instance, when a person has worn a wearable device equipped with the wireless communication module 100D, capacitance of the antenna unit 1 changes. Then, in a state when a human body has approached the antenna, the DC voltage signal D depending on a change in capacitance of the antenna unit 1 will become more than the predetermined threshold at step S104 and the procedure goes to step S105. After that, the transceiver 31D, the arithmetic processor 32D, and the second oscillator 5D are activated at step S106. Then, at step S107, the transceiver 31D performs Advertising (A) with a 2.4 GHz radio signal (RF), establishes a radio connection, and performs wireless communication (R). After completion of wireless communication at step S108, the radio control unit 3D transits into the halt state at step S109.

As described above, the wireless communication module 100D pertaining to the modification example of the second embodiment is configured such that the proximity detector 2D for human bodies generates a DC voltage signal D depending on a change in capacitance of the antenna unit 1. Also, in the wireless communication module 100D thus configured, the interrupt controller 34 determines whether or not the DC voltage signal is more than a predetermined threshold and generates an interrupt signal, if the DC voltage signal D is more than the predetermined threshold. Also, in the wireless communication module 100D thus configured, the transceiver 31D, the arithmetic processor 32D, and the second oscillator 5D are activated by input of an interrupt signal. Furthermore, in the wireless communication module 100D thus configured, after completion of wireless communication, the halt controller 33D deactivates the transceiver 31D, the arithmetic processor 32D, and the second oscillator 5D.

That is, the wireless communication module 100D pertaining to the modification example of the second embodiment is configured such that the halt controller 33D activates the transceiver 31D, the arithmetic processor 32D, and the second oscillator 5D, based on a result of detection by the proximity detector 2D for human bodies, and after completion of wireless communication by the transceiver 31D, deactivates the transceiver 31D, the arithmetic processor 32D, and the second oscillator 5D. Thereby, the wireless communication module 100D pertaining to the modification example of the second embodiment enables it to further reduce power consumption, as compared with the wireless communication module 100C of the second embodiment.

Third Embodiment

Figure 12:
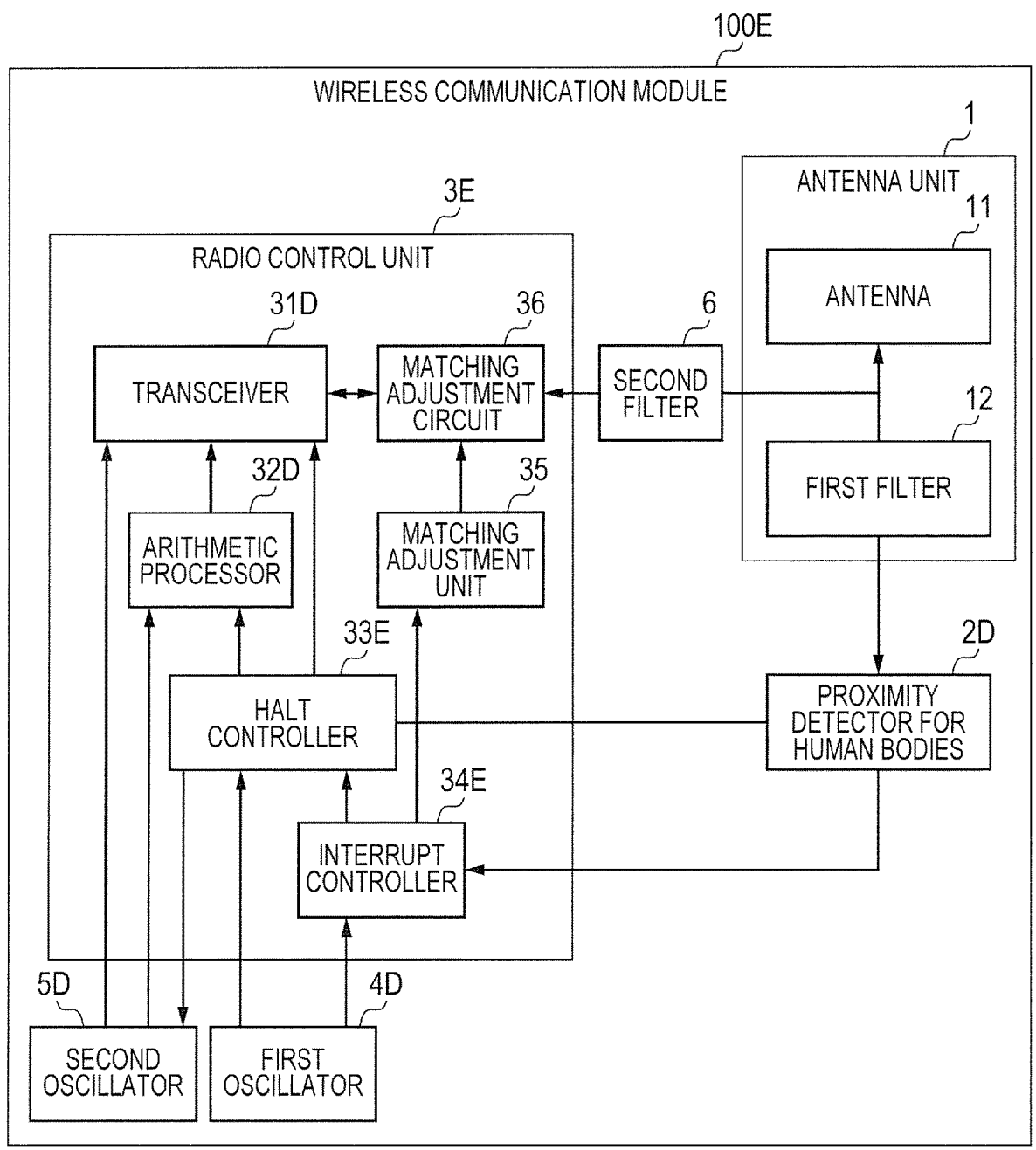
FIG. 12 is a block diagram depicting a configuration example of a wireless communication module pertaining to a third embodiment.

Subsequently, descriptions are provided about a configuration of a wireless communication module 100E pertaining to a third embodiment, using a block diagram of FIG. 12. The wireless communication module 100E includes an antenna unit 1, a proximity detector 2D for human bodies, a radio control unit 3E, a first oscillator 4D, a second oscillator 5D, and a second filter 6. Also, the antenna unit 1 includes an antenna 11 and a first filter 12. Moreover, the radio control unit 3E includes a transceiver 31D, an arithmetic processor 32D, a halt controller 33E, an interrupt controller 34E, a matching adjustment unit 35, and a matching adjustment circuit 36.

When the interrupt controller 34E receives a DC voltage signal D from the proximity detector 2D, it determines whether or not the DC voltage signal D is more than a predetermined threshold. If the DC voltage signal D is equal to or less than the predetermined threshold, the interrupt controller 34E outputs an activation signal to the halt controller 33E.

If the DC voltage signal D is more than the predetermined threshold, the interrupt controller 34E generates an interrupt signal and outputs it to the matching adjustment unit 35. Also, the interrupt controller 34E outputs an activation signal to the halt controller 33E after matching adjustment by the matching adjustment unit 35.

Upon receiving the activation signal, the halt controller 33E activates the transceiver 31D, the arithmetic processor 32D, and the second oscillator 5D. At the same time, upon receiving the activation signal, the halt controller 33E stops supplying the first clock single of 32.768 kHz to the antenna unit 1. Thereby, the radio control unit 3E is placed in normal operation mode.

Upon completion of wireless communication by the transceiver 31D, the halt controller 33E deactivates the transceiver 31D, the arithmetic processor 32D, and the second oscillator 5D. At the same time, upon completion of wireless communication by the transceiver 31D, the halt controller 33E starts supplying the first clock single of 32.768 kHz to the antenna unit 1. Thereby, the radio control unit 3E is placed in the halt state.

Figure 13:
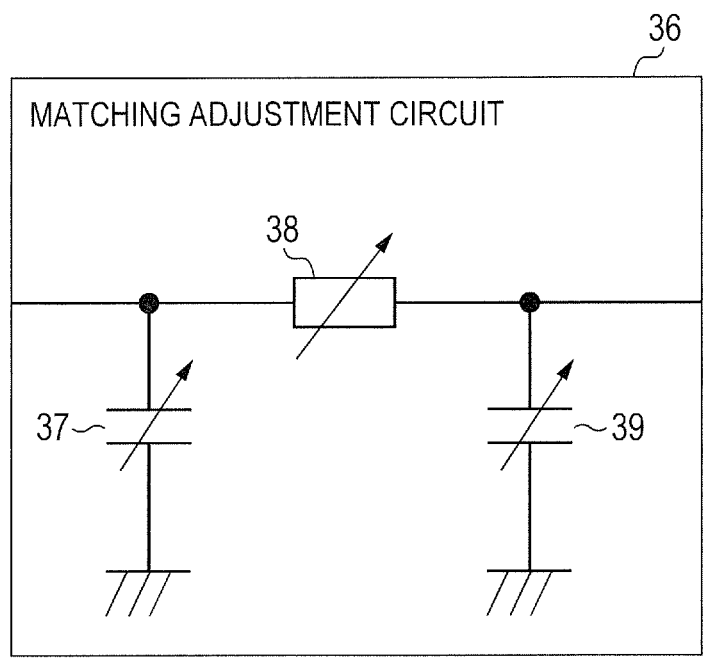
FIG. 13 is a diagram depicting a configuration example of a matching adjustment circuit pertaining to the third embodiment.

When receiving input of an interrupt signal, the matching adjustment unit 35 adjusts the matching adjustment circuit 36. And now, the matching adjustment circuit 36 is placed between the second filter 6 and the transceiver 31D. Besides, the matching adjustment circuit 36 is configured, for example, as is depicted in FIG. 13; however, no limitation to the configuration in FIG. 13 is intended. In the example of FIG. 13, the matching adjustment circuit 36 includes a variable capacitor 37, a variable inductor 38, and a variable capacitor 39.

The matching adjustment unit 35 adjusts the antenna 11 to an optimal characteristic impedance by adjusting the matching adjustment circuit 36. And now, an optimal characteristic impedance is, for example, 50Ω.

Figure 14:
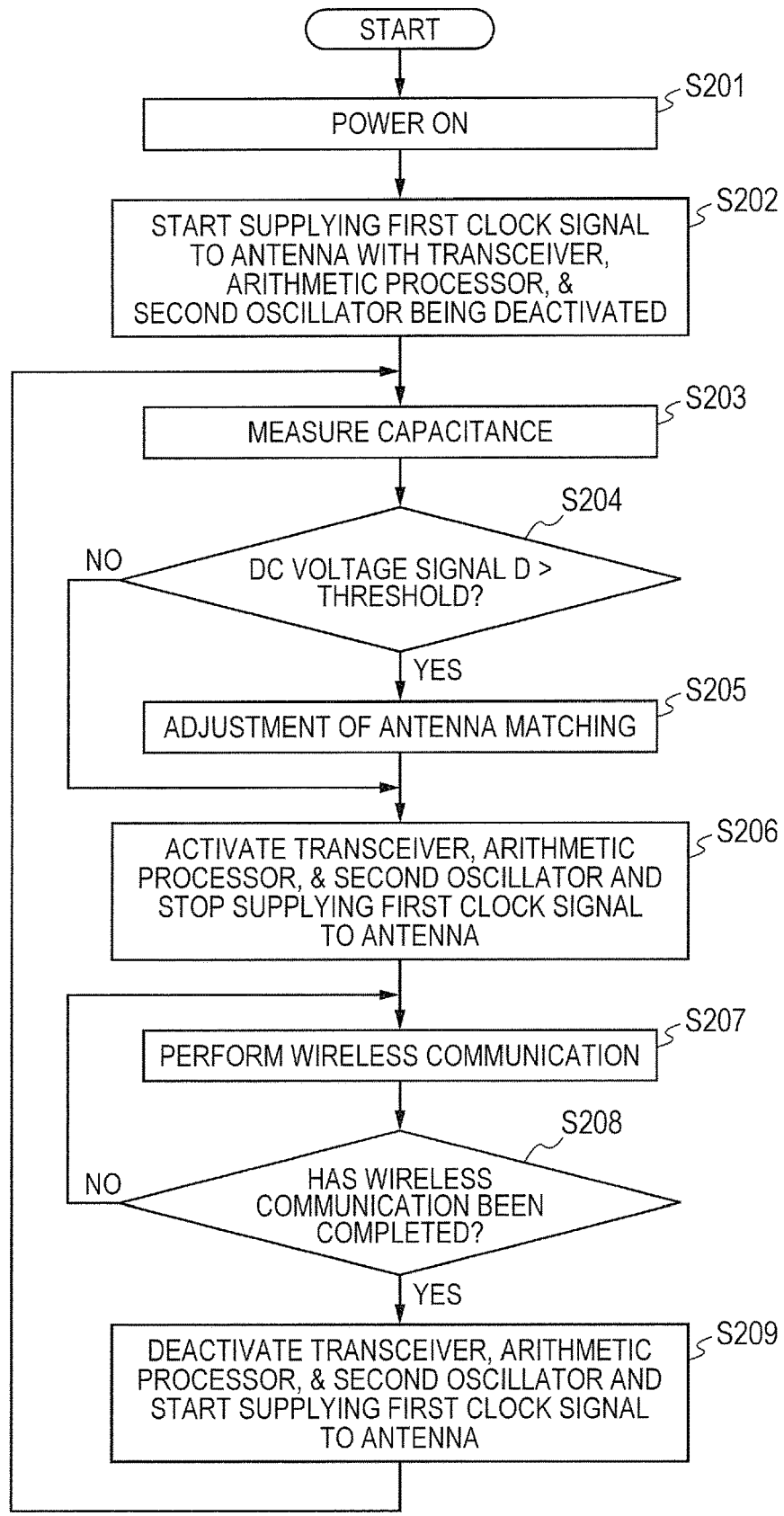
FIG. 14 is a flowchart illustrating an example of operation of the wireless communication module pertaining to the third embodiment.

Subsequently, descriptions are provided about an example of operation of the wireless communication module 100E pertaining to the third embodiment, using a flowchart of FIG. 14.

After power-on of the wireless communication module 100E (step S201), first, the halt controller 33E deactivates the transceiver 31D, the arithmetic processor 32D, and the second oscillator 5D and starts supplying the first clock signal to the antenna unit 1 (step S202).

Then, the proximity detector 2D for human bodies measures capacitance of the antenna unit 1 (step S203). That is, the proximity detector 2D for human bodies generates a DC voltage signal D depending on a change in capacitance of the antenna unit 1.

Then, the interrupt controller 34E determines whether or not the DC voltage signal D is more than a predetermined threshold (step S204).

If the DC voltage signal D is more than the predetermined threshold (YES at step S204), the matching adjustment unit 35 executes a matching adjustment of the antenna 11 (step S205). After step S205, the halt controller 33E activates the transceiver 31D, the arithmetic processor 32D, and the second oscillator 5D and stops supplying the first clock signal to the antenna unit 1 (step S206).

Otherwise, if the DC voltage signal D is equal to or less than the predetermined threshold (NO at step S204), control in step S206 is performed, skipping step S205.

Then, the transceiver 31D performs wireless communication (step S207). Then, the halt controller 33E determines whether or not wireless communication has been completed (step S208).

If wireless communication is not completed (NO at step S208), the procedure returns to step S207. Otherwise, if wireless communication has been completed (YES at step S208), the halt controller 33E deactivates the transceiver 31D, the arithmetic processor 32D, and the second oscillator 5D and starts supplying the first clock signal to the antenna unit 1 (step S209). After step S209, the procedure returns to step S203.

Figure 15:
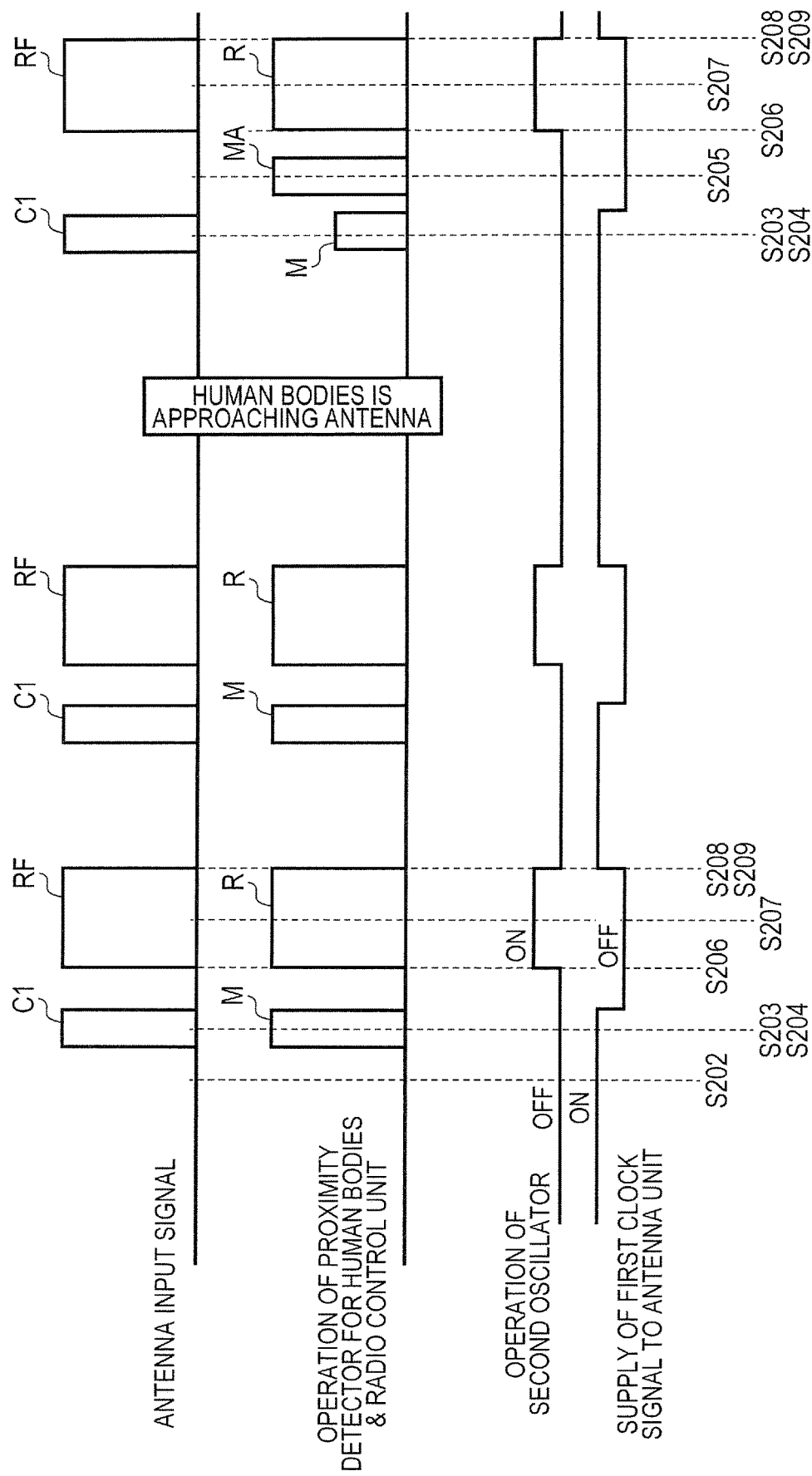
FIG. 15 is a diagram depicting examples of waveforms with regard to the operation in FIG. 14.

Subsequently, with FIG. 15, descriptions are provided about examples of waveforms with regard to the operation in FIG. 14. At step S203, the antenna input signal is the first clock signal (C1) and measurements (M) of capacitance of the antenna unit 1 are taken by the proximity detector 2D for human bodies.

In a state when a human body does not approach the antenna, the DC voltage signal D depending on a change in capacitance of the antenna unit 1 will be equal to or less than the predetermined threshold at step S204. Hence, a matching adjustment (MA) of the antenna 11 at step S205 is not executed. After that, the transceiver 31D, the arithmetic processor 32D, and the second oscillator 5D are activated at step S206. Then, the procedure goes to step S207 and the transceiver 31D performs wireless communication (R) with a 2.4 GHz radio signal (RF).

Otherwise, in a state when a human body has approached the antenna, the DC voltage signal D depending on a change in capacitance of the antenna unit 1 will become more than the predetermined threshold at step S204 and the procedure goes to step S205. Hence, a matching adjustment (MA) of the antenna 11 is executed at step S205. After that, the transceiver 31D, the arithmetic processor 32D, and the second oscillator 5D are activated at step S206. Then, the procedure goes to step S207 and the transceiver 31D performs wireless communication (R) with a 2.4 GHz radio signal (RF).

As described above, the wireless communication module 100E pertaining to the third embodiment is configured such that the matching adjustment unit 35 executes a matching adjustment of the antenna 11, based on a result of detection by the proximity detector 2D for human bodies. Thereby, it is possible to eliminate a problem in which a human body (dielectric body) or the like approaching the antenna causes a change in radiation resistance from the antenna and results in mismatched characteristic impedance.

And now, while the examples in which the wireless communication module is equipped with an antenna were described in the second embodiment, the modification example of the second embodiment, and the third embodiment, the wireless communication module may be configured without being equipped with an antenna, as in the modification example of the first embodiment.

Processing to be performed by the functional parts of the wireless communication module described in the embodiments may be implemented by causing at least one processor (e.g., a microprocessor, MPU, or DSP (Digital Signal Processor)) to execute a program.

While the invention made by the present inventors has been described specifically based on its embodiments hereinbefore, it will be appreciated that the present invention is not limited to the embodiments described previously and various modifications may be made thereto without departing from the gist of the invention.

What is claimed is:

1. A wireless communication module comprising:
an antenna unit;
a proximity detector which detects that a human body has approached the module,
the antenna unit comprising:
an antenna; and
a first filter which is comprised of distributed constant elements,
wherein the proximity detector uses the antenna and the first filter as an electrode to detect capacitance; and
a radio control unit,
the radio control unit comprising:
an arithmetic processor;
a transceiver which performs wireless communication through the antenna under control of the arithmetic processor; and
a halt controller,
wherein the halt controller controls an active state of at least one of the arithmetic processor and the transceiver, based on a result of detection by the proximity detector for human bodies.

2. The wireless communication module according to claim 1, further comprising:
a first oscillator which oscillates a first clock signal with a first frequency; and
a second oscillator which oscillates a second clock signal with a second frequency which is higher than the first frequency,
wherein the arithmetic processor and the transceiver operate on the second clock signal, and
wherein the halt controller operates on the first clock signal.

3. The wireless communication module according to claim 2, wherein the proximity detector for human bodies detects a change in capacitance of the antenna and the first filter through the use of the first clock signal.

4. The wireless communication module according to claim 2, wherein the halt controller activates the transceiver, the arithmetic processor, and the second oscillator, based on a result of detection by the proximity detector for human bodies, and after completion of wireless communication by the transceiver, deactivates the transceiver, the arithmetic processor, and the second oscillator.

5. The wireless communication module according to claim 2, wherein the first filter allows passage of the first frequency and attenuates a frequency of a radio signal which is transmitted and received by the antenna.

6. The wireless communication module according to claim 2, further comprising a second filter which allows passage of a frequency of a radio signal which is transmitted and received by the antenna and attenuates the first frequency.

7. The wireless communication module according to claim 1, wherein the antenna is a linear antenna.

8. The wireless communication module according to claim 1, further comprising a matching adjustment unit,
wherein the matching adjustment unit executes a matching adjustment of the antenna, based on a result of detection by the proximity detector for human bodies.

* * * * *